United States Patent [19]

Liu

[11] Patent Number: 5,270,223
[45] Date of Patent: Dec. 14, 1993

[54] MULTIPLE LAYER WIDE BANDGAP COLLECTOR STRUCTURE FOR BIPOLAR TRANSISTORS

[75] Inventor: William U. Liu, Dallas, Tex.
[73] Assignee: Texas Instruments Incorporated, Dallas, Tex.
[21] Appl. No.: 723,111
[22] Filed: Jun. 28, 1991
[51] Int. Cl.⁵ .................... H01L 21/265/29; H01L 70
[52] U.S. Cl. ..................... 437/31; 257/197; 257/198; 437/128
[58] Field of Search ............ 437/31; 257/192, 198

[56] References Cited

U.S. PATENT DOCUMENTS

| | | | |
|---|---|---|---|
| 3,638,081 | 1/1972 | Lloyd | 257/545 |
| 4,679,305 | 7/1987 | Morizuka | 257/197 |
| 4,825,269 | 4/1989 | Plummer et al. | 257/197 |
| 4,889,831 | 12/1989 | Ishii et al. | 148/10 |
| 4,933,732 | 6/1990 | Katoh et al. | 257/197 |
| 4,958,208 | 9/1990 | Tanaka | 257/12 |
| 5,010,382 | 4/1991 | Katoh | 257/15 |
| 5,019,890 | 5/1991 | Ishibashi et al. | 257/197 |
| 5,084,750 | 1/1992 | Adlerstein | 257/197 |
| 5,124,270 | 6/1992 | Morizuka | 257/197 |

FOREIGN PATENT DOCUMENTS

| | | | |
|---|---|---|---|
| 3236359 | 10/1988 | Japan | 252/197 |
| 1-194359 | 8/1989 | Japan | 257/197 |
| 0251660 | 10/1989 | Japan | 257/197 |
| 2291135 | 11/1990 | Japan | 257/197 |
| 3-138950 | 6/1991 | Japan | 257/197 |

OTHER PUBLICATIONS

Kirk, "A Theory of Transistor Cutoff Frequency (fr) Falloff at High Current Densities", *IRE Transactions on Electron Devices*, ED-9, pp. 164, 1962.
Sze, *Physics of Semiconductor Devices*, 2nd Edition, pp. 145-147, (Wiley & Sons, 1981).
Pritchard, *Electrical Characteristics of Transistors*, pp. 297-298, (McGraw Hill, 1967).
Bulman, et al., "the Determination of Impact Ionization Coefficients in (100) Gallium Arsenide Using Avalanche Noise and Photocurrent Multiplication Measurements", *IEEE Transactions on Electron Devices*, ED-32, p. 2454, 1985.
Sze, et al., "Avalanche Breakdown voltages of Abrupt and linearly Graded p-n Junctions in Ge, Si, GaAs, and GaP", *Applied Physics Letters*, vol. 8, pp. 111-113, 1966.

*Primary Examiner*—Olik Chaudhuri
*Assistant Examiner*—Long Pham
*Attorney, Agent, or Firm*—Michael K. Skrehot; James C. Kesterson; Richard L. Donaldson

[57] ABSTRACT

Generally, and in one form of the invention, a multiple layer wide bandgap collector structure is provided which comprises a relatively thin, highly doped layer 12 and a relatively thick, low doped or non-intentionally doped layer 14.

Other devices, systems and methods are also disclosed.

16 Claims, 4 Drawing Sheets

MULTIPLE LAYER WIDE BANDGAP COLLECTOR STRUCTURE FOR BIPOLAR TRANSISTORS

CROSS-REFERENCE TO RELATED APPLICATIONS

The following coassigned patent application is hereby incorporated herein by reference: Ser. No. 07/722984, filing date Jun. 28, 1991, now U.S. Pat. No. 5,171,697.

FIELD OF THE INVENTION

This invention generally relates to a multiple layer wide bandgap collector structure for bipolar transistors.

BACKGROUND OF THE INVENTION

Without limiting the scope of the invention, its background is described in connection with heterojunction bipolar transistors (HBTs), as an example.

Heretofore, in this field, two of the most important figures of merit in power HBT design have been the emitter-collector breakdown voltage, $BV_{ceo}$, and the maximum operating current density prior to base pushout, $J_{max}$. For a transistor under a given bias condition, its output power is directly proportional to the product of the operating emitter-collector voltage and the collector current density. Therefore, one would like to design a power transistor to operate at large emitter-collector voltage and collector current density. However, when the emitter-collector voltage is increased to an extreme, the base-collector junction breakdown eventually occurs and the transistor ceases to operate. The voltage at which the breakdown occurs is essentially the emitter-collector breakdown voltage, $BV_{ceo}$.

On the other hand, power can also be increased by increasing the operating collector current density level. As with the case of increasing emitter-collector voltage, there is a limit to the operating collector current density level, $J_{max}$, beyond which the transistor ceases to function properly. The physical effect imposing this limit of current density level is called the base pushout effect (also known as the Kirk effect). When the operating collector current density is larger than $J_{max}$, the number of free carriers entering the base-collector space-charge region becomes so large that the carriers greatly modify the background charge in that region. Consequently, the electric field at the base side of the base-collector junction decreases to zero, and the base majority carriers spill over into the junction. At this point, the effective base width suddenly increases and current gain dramatically decreases, causing the transistor to cease to function properly.

In practice, both of these parameters are heavily influenced by the design of the collector, which can be varied in both thickness and doping concentration. The collector thickness of an HBT designed for high power applications is generally required to be as thick as possible, so that a large reverse base-collector junction voltage can be sustained. However, when carried to an extreme, the collector space charge transit time becomes so large that the transistor cannot effectively function at frequencies of interest. As the thickness of the collector is increased, the time required for carriers to cross the collector (known as the collector space charge transit time, or collector transit time) also increases. When the collector transit time becomes a substantial fraction of one period or cycle at the frequency of operation, the current gain and efficiency of the transistor are drastically reduced at that frequency. With a thicker collector, a larger reverse base-collector junction voltage can be sustained and, therefore, $BV_{ceo}$ becomes larger. Typically, for HBTs designed for X-band operation (6.2 GHz-10.9 GHz), the collector thickness is constrained to 1 μm or less. Consequently, the breakdown voltage is limited to a certain value determined by the material properties of the collector, such as the maximum breakdown electric field. In the case of a GaAs collector, the maximum attainable emitter collector breakdown voltage, $BV_{ceo}$, is roughly 24 V. The only remaining design option when using GaAs is thus the collector doping. With only this one design parameter to work with, the collector doping profile must be a tradeoff between the maximization of $BV_{ceo}$ or $J_{max}$. At one extreme, it is desired to make this collector doping level, $N_{coll}$, as heavy as possible so that the base pushout effects start at a much higher current density, given as:

$$J_{max} = q \times N_{coll} \times V_{sat}$$

where:

q is the electronic charge $V_{sat}$ is the saturation velocity of the carriers

Consequently, $J_{max}$ is large and the transistor can be operated at higher current levels.

At the other extreme, it is desired to make the collector doping profile as light as possible, so that a higher voltage can be sustained across the base-collector junction before the junction breakdown occurs. In this manner, $BV_{ceo}$ can be increased, and the transistor can be operated at higher voltages.

Therefore, a problem faced with the conventional single-layer GaAs collector has been that there is virtually no design freedom for substantially independent and simultaneous increase of both $BV_{ceo}$ and $J_{max}$ by varying just the collector doping level. Another problem faced has been that the maximum attainable $BV_{ceo}$ has been limited to roughly 24 V. Accordingly, improvements which overcome any or all of these problems are presently desirable.

SUMMARY OF THE INVENTION

It is herein recognized that a need exists for a bipolar transistor with independent control of $J_{max}$ and $BV_{ceo}$. The present invention is directed towards meeting those needs.

Generally, and in one form of the invention, a multiple layer wide bandgap collector structure is provided which comprises a relatively thick, low doped or non-intentionally doped layer and a relatively thin, highly doped layer.

In another form of the invention, there is provided a high power bipolar transistor comprising a substrate, subcollector layer on the substrate, a graded layer on the subcollector layer, a relatively thick and low doped or non-intentionally doped first collector layer on the graded layer, a relatively thin and highly doped second collector layer on the first collector layer, a base layer on the second collector layer, and an emitter layer on the base layer.

In yet another form of the invention, there is provided a method for making a multiple layer wide bandgap collector structure comprising the steps of forming a relatively thick and low doped or non-intentionally doped layer and epitaxially depositing a relatively thin and highly doped layer on the low doped or non-intentionally doped layer.

In still another form of the invention, a method for making a high power bipolar transistor is provided, comprising the steps of forming a substrate, epitaxially depositing a subcollector layer on the substrate, epitaxially depositing a graded layer on the subcollector layer, epitaxially depositing a first collector layer on the graded layer, the first collector layer being relatively thick and low doped or non-intentionally doped, epitaxially depositing a second collector layer on the first collector layer, the second collector layer being relatively thin and highly doped, epitaxially depositing a base layer on the second collector layer, and epitaxially depositing an emitter layer on the base layer.

An advantage of the invention is that it allows the relatively independent control of $J_{max}$ and $BV_{ceo}$ in a bipolar transistor.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

Figure 1:
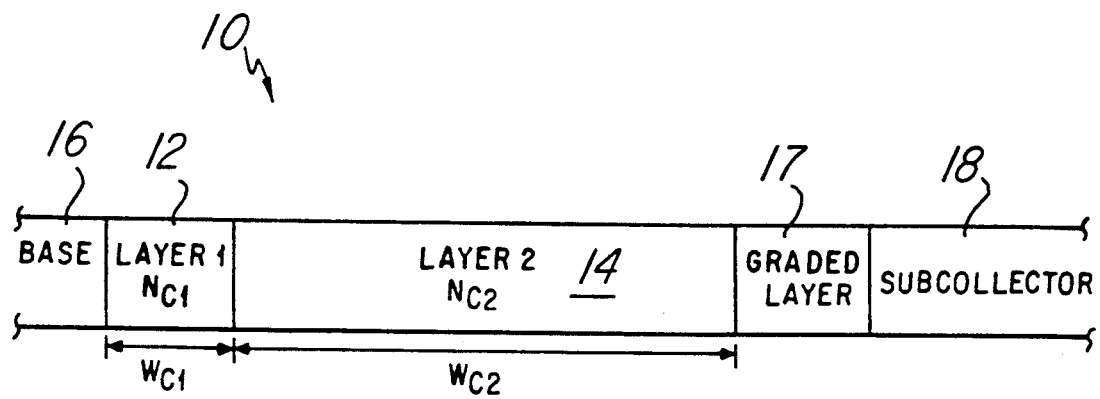
FIG. 1 is a schematic view of a first preferred embodiment of the present invention.

With reference to FIG. 1, a first preferred embodiment of the present invention is described hereinbelow which solves the dilemmas of constrained $BV_{ceo}$ and of choosing between mutually exclusive collector doping profiles in attempting to maximize the values of $BV_{ceo}$ and $J_{max}$ by utilizing a novel two-layer collector structure incorporating AlGaAs.

The first preferred embodiment of the present invention is comprised of a transistor indicated generally at 10, having a collector composed of two distinct layers 12 and 14. The first collector layer 12 is disposed next to a base 16, the second collector layer 14 is disposed between the first collector layer 12 and a graded layer 17. The first collector layer 12 is composed of $Al_xGa_{1-x}As$, with the aluminum composition graded from 0% at the junction with the base 16 to 100%, for example, at the junction with the second collector layer 14. The first collector layer 12 has a width (measured in the direction of current flow) $W_{C1}$ of 400 Angstroms, for example, and is doped at a relatively high concentration level $N_{C1}$, such as $1 \times 10^{18}$ atoms/cm$^3$. The second collector layer 14 is also composed of $Al_xGa_{1-x}As$, but has a uniform aluminum composition of 100%, for example (AlAs is used as an example since the bandgap of $Al_xGa_{1-x}As$ is highest at this particular composition. However, this design is completely general, and the aluminum composition is not restricted to 100%). The second collector layer 14 has a width (measured in the direction of current flow) $W_{C2}$ of 1 μm, for example, and does not have any intentional doping $N_{C2}$. The graded layer 17 is made of $Al_xGa_{1-x}As$ with a 100% aluminum composition (AlAs), for example, at the interface with collector layer 14, decreasing to 0% (GaAs) at the interface with the subcollector 18. The graded layer 17 is preferably 300 Å thick and doped with Si to a concentration of approximately $5 \times 10^{18}$ cm$^{-3}$. The exact doping concentration of layer 17 is not critical since it is not part of the active collector layer (layers 12 and 14). A relatively high doping concentration will make the extra (though small) resistance associated with this layer 17 negligible.

The first collector layer 12, which is adjacent to the base 16, is doped heavily, but its width $W_{C1}$ must be thin enough so that this layer is depleted, preferably even at zero external base-collector bias. This is because during the operation of a high frequency power bipolar transistor, the base-emitter bias is continuously varied from zero to a value limited by $BV_{ceo}$. If during any part of the cycle the collector is not fully depleted, part of the power will be dissipated in the undepleted portion of the collector, which constitutes essentially a parasitic collector resistance. Consequently, if the collector can be fully depleted even at zero bias, then there will be no parasitic power dissipation associated with the collector at any given bias condition. The purpose of this thin, heavily doped layer 12 is to create a large magnitude of electric field in the junction area close to the base layer 16. This large field prevents the base pushout effects from occurring at lower current levels and, consequently, $J_{max}$ increases.

When a carrier travels in a base-collector junction, it travels, on average, a "mean free path", before interacting with an atom in the lattice and losing its energy. However, if the emitter-collector bias increases toward $BV_{ceo}$, the electric field in the junction becomes large. Consequently, the carrier can gain sufficient energy from the field while traveling within its mean free path, such that it breaks the bond between the atom core and one of the bound electrons upon impacting the lattice. The initial carrier, as well as the hole and electron created by the collision are then free to leave the region of the collision. This process is called impact ionization. When the emitter-collector bias is larger than $BV_{ceo}$, the events of impact ionization are so numerous that the collector current due to the ionized carrier becomes infinitely large and the transistor ceases to function properly. At this point, the transistor is said to reach the emitter-collector breakdown condition. It should be noted that carriers in GaAs must acquire a threshold energy of 1.7 eV before impact ionization can occur. Therefore, it is important that the first collector layer 12 be made thin (i.e. small $W_{C1}$) so that even when carriers traverse this high field region, the amount of energy the carriers pick up from the electric field is below 1.7 eV and therefore they have not acquired enough energy to cause avalanche breakdown. With this design principle, most of the impact ionizations actually occur in the second collector layer 14, rather than in the high field region of the first collector layer 12. Consequently, it is desirable that the second collector layer 14 be made thick (i.e. large $W_{C2}$) and lightly doped (i.e. small $N_{C2}$) so that it will sustain a large voltage drop before the junction breakdown occurs. Therefore, $BV_{ceo}$ increases.

The fact that avalanche breakdown initiates from this low field second collector layer 14 has been verified with a computer simulation which utilizes the most recent electron and hole impact ionization coefficients. It has been calculated that, despite the fact that the first collector layer 12 is a high field region, it only contributes approximately 5% of the impact ionizations at the onset of avalanche breakdown. Consequently, to increase the breakdown voltage $BV_{ceo}$ even further, the second collector layer 14 is made of $Al_xGa_{1-x}As$, which can sustain a higher voltage drop before avalanche breakdown occurs due to its larger bandgap compared to GaAs. The breakdown voltage $BV_{ceo}$ is approximately proportional to the 3/2 power of the bandgap. For a 1 μm GaAs collector structure, the $BV_{ceo}$ is calculated to be 24 V. On the other hand, with the use of $Al_{1.00}Ga_{0.00}As$ in the second collector layer 14, the $BV_{ceo}$ is expected to reach 44.4 V, which is nearly a 185% increase.

It is not necessary to have the first collector layer 12 be composed of $Al_xGa_{1-x}As$ since the major portion of the impact ionization contributing to the eventual avalanche breakdown originates from the second collector layer 14. In fact, the first collector layer 12 is graded so that an abrupt band discontinuity does not exist at the base-collector junction. The undesirable effects of quantum reflection and dramatic carrier collection reduction associated with an abrupt junction thus do not appear. In addition, this first layer is sufficiently thin so that the entire collector is fully depleted, even at zero external base-collector bias. Its thickness $W_{C1}$ is thus typically between 200 Å and 500 Å, which, fortuitously, is the grading distance required for typical epitaxial growth techniques.

It can therefore be seen that with the first preferred embodiment of the invention, $J_{max}$ can be increased by heavily doping a thin collector layer 12 adjacent to the base 16, while $BV_{ceo}$ can also be increased by simply inserting a thick, unintentionally doped $Al_xGa_{1-x}As$ collector layer 14 between the first collector layer 12 and the subcollector 18. Both $J_{max}$ and $BV_{ceo}$ can thus essentially be simultaneously and independently increased, without any trade off.

Figure 2:
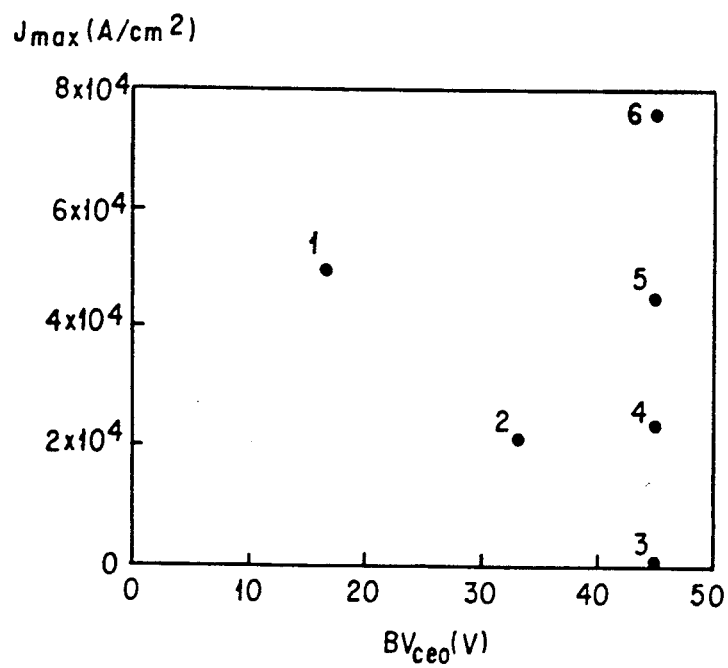
FIG. 2 is a data plot of computer simulated values of $J_{max}$ and $BV_{ceo}$ for devices incorporating the collector structures of Table I.

FIG. 2 illustrates the results of a computer simulation program used to calculate $J_{max}$ and $BV_{ceo}$ for the various device structures listed in Table I (the numbered points on the graph of FIG. 2 correspond to the device numbers of Table I).

TABLE I

| Device | $N_{C1}$ | $W_{C1}$ | $N_{C2}$ | $W_{C2}$ |
|---|---|---|---|---|
| 1 | $5 \times 10^{16}$ | 1 μm | | |
| 2 | $2 \times 10^{16}$ | 1 μm | | |
| 3 | $1 \times 10^{14}$ | 1 μm | | |
| 4 | $1 \times 10^{17}$ | 1000 Å | $1 \times 10^{14}$ | 1 μm |
| 5 | $5 \times 10^{17}$ | 500 Å | $1 \times 10^{14}$ | 1 μm |
| 6 | $1 \times 18^{18}$ | 400 Å | $1 \times 10^{14}$ | 1 μm |

The software used to run the simulation was implemented with accurate base pushout analyses and avalanche coefficients for electrons and holes in GaAs. The results were then translated using the 3/2 power rule to obtain the equivalent $BV_{ceo}$ data for AlAs. Preliminary experimentation correlates well with the program calculations. It is readily evident from the first three data points plotted in FIG. 2, which represent the performance of a standard one-layer collector structure as shown in Table I, that there is an almost perfect inverse relationship between $J_{max}$ and $BV_{ceo}$ for these devices. By contrast, data points 4, 5 and 6, which represent the performance of devices constructed according to the first preferred embodiment of the present invention as shown in Table I, illustrate that $J_{max}$ can substantially be increased independent of any effect on $BV_{ceo}$, by simply changing the thickness $W_{C1}$ and the doping concentration $N_{C1}$ of the first collector layer 12. Additionally, a sensitivity analysis has been performed which shows that for HBTs designed for X-band applications in which the collector thickness $W_{C2}$ is limited to 1 μm, the unintentionally doped second collector layer 14 can have a doping concentration $N_{C2}$ as high as $1 \times 10^{16}$ atoms/cm$^3$ (donor or acceptor) before a sudden drop of $BV_{ceo}$ takes place. Since growth techniques such as molecular beam epitaxy (MBE) and metal organic chemical vapor deposition (MOCVD) can reproducibly grow unintentionally doped layers at doping concentrations below $1 \times 10^{15}$ atoms/cm$^3$, and often achieving a concentration of $1 \times 10^{14}$ atoms/cm$^3$, the proposed structure of the first preferred embodiment of the present invention can be practically fabricated.

The method for fabricating a second preferred embodiment of the present invention includes the following steps as illustrated in cross sectional elevation views in FIGS. 3A–3E. It incorporates a heterojunction bipolar transistor (HBT) design that is described in copending application Ser. No. 07/576,540, which is incorporated herein by reference. Although the second preferred embodiment is illustrated with a heterojunction device, the present invention may be practiced with any bipolar structure.

Figure 3A:
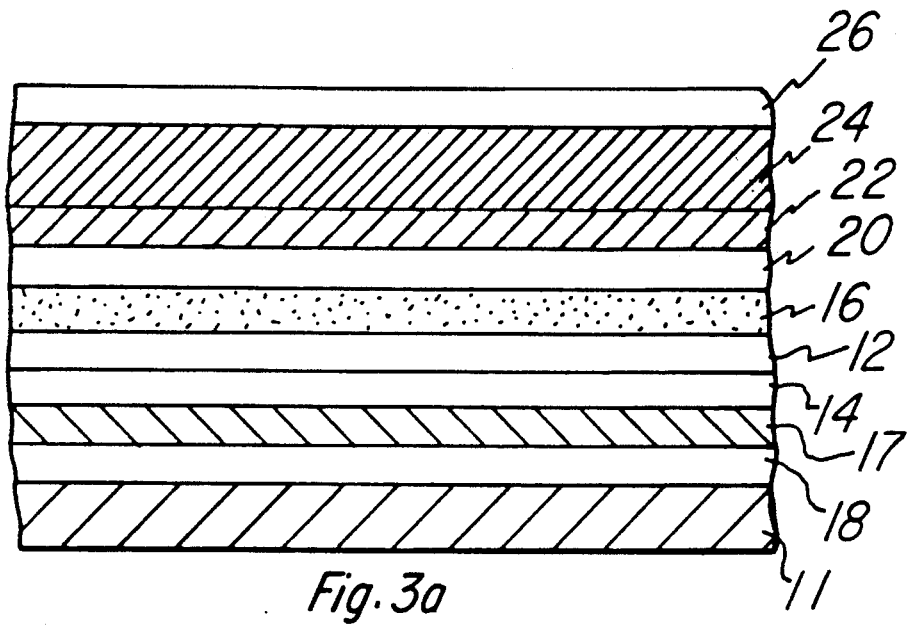
FIG. 3A-3E is a cross-sectional view showing the steps of a second preferred embodiment fabrication process of the present invention.
Figure 3B:
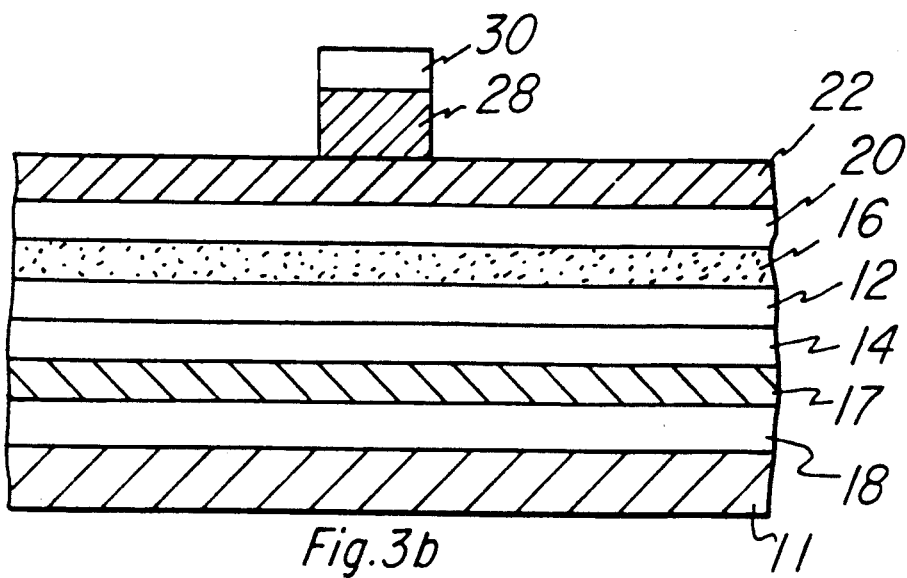

(a) A substrate material for this process is shown in FIG. 3A; note that the vertical is exaggerated in the drawings for clarity. It is composed of a semi-insulating semiconductor material 11 (such as GaAs) of (100) orientation.

(b) a subcollector layer 18 of n-type GaAs, for example, is epitaxially grown on the substrate 11 by a suitable process (such as Metal Organic Chemical Vapor Deposition, or MOCVD) to a thickness of 1 micron and doped with Si to a concentration of approximately $5 \times 10^{18}$ cm$^{-3}$. An $Al_xGa_{1-x}As$ graded layer 17 is next epitaxially grown on top of subcollector 18. The thickness of layer 17 is typically 300 Å, and the aluminum composition is graded from 0% (GaAs) at the subcollector 18 interface to, for example, 100% (AlAs) at the opposite end (i.e. if AlAs is the chosen material for collector layer 14). The doping of this layer is also with Si to a concentration of approximately $5 \times 10^{18}$ cm$^{-3}$.

(c) a collector layer 14 is epitaxially grown on graded layer 17 to a thickness of 1 μm and is preferably made of AlAs. The doping of layer 14 is preferably unintentional and as low as possible (~$10^{14}$ cm$^{-3}$). However, as mentioned previously, sensitivity analysis indicates that a doping as high as ~$10^{16}$ cm$^{-3}$ is tolerable. A second collector layer 12 is epitaxially grown on collector layer 14 and is of graded $Al_xGa_{1-x}As$, with aluminum composition varying from 100% (AlAs) at the collector 14 interface to 0% (GaAs) at the opposite end. Layer 12 is grown to a thickness of approximately 400 Å and is doped with Si, for example, to approximately $1 \times 10^{18}$ cm$^{-3}$.

(d) a base epilayer 16 of GaAs, for example, is deposited onto collector layer 12 to a thickness of 0.08 μm and doped with C, for example, to a concentration of approximately $\geq 3 \times 10^{19}$ cm$^{-3}$. Emitter epilayer 20 of n-type $Al_xGa_{1-x}As$ is then deposited onto base layer 16 at a thickness of 0.05 micron by epitaxy. Next, 500 Angstrom thick AuGe emitter ohmic contact metal, followed by 140 Angstrom Ni and 2000 Angstrom Au layers are evaporated onto the surface. Insulator layer 28 is then formed of a suitable material (such as $SiO_2$ or $Si_3N_4$) at a thickness of 4000 Angstroms by chemical vapor deposition (CVD). A photoresist 30 is then spun on the previous layers and patterned to define the location of the HBT emitters. The emitter locating insulator islands 28 are then created by a reactive ion etch (RIE) of the insulator material not protected by the photoresist using $CF_4$ and $O_2$. Photoresist 30 may optionally be removed after RIE. This yields the structure of FIG. 3B.

Figure 3C:
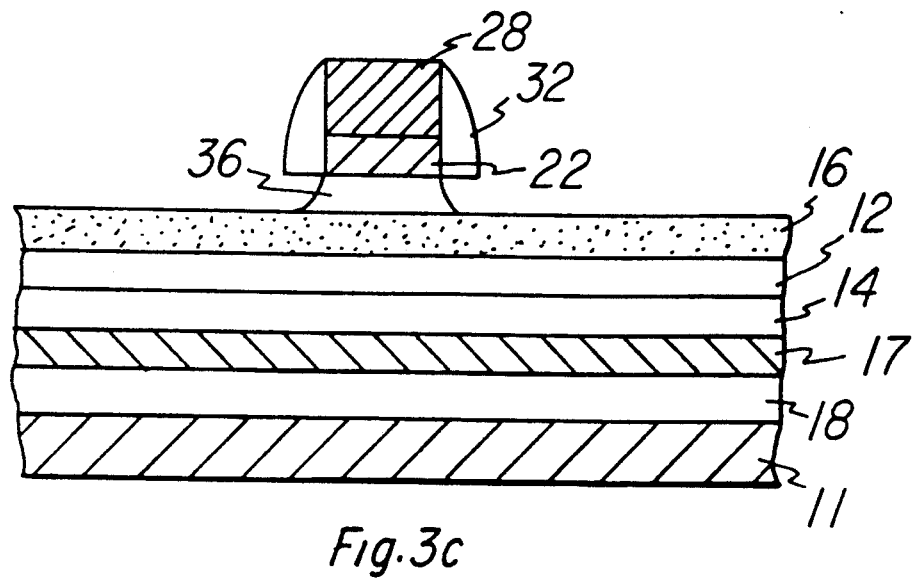
Figure 3D:
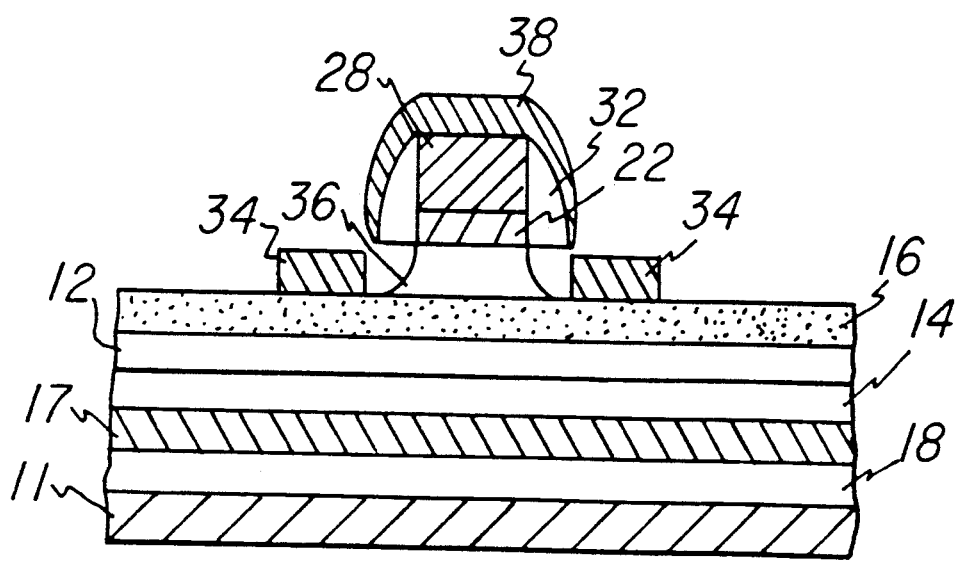
Figure 3E:
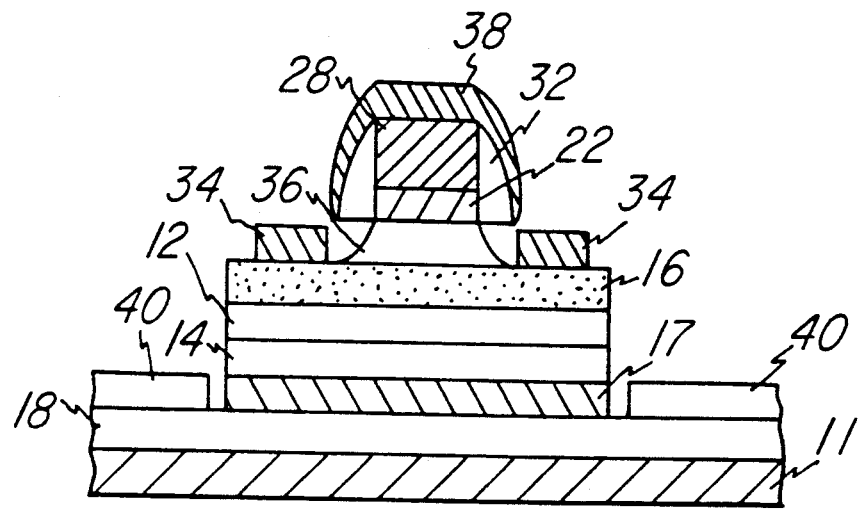

(e) Ohmic contact layer 22 is then removed from areas not protected by the insulator islands 28 by ion milling using Ar, preferably at a 30° angle to minimize backsputtering, creating emitter contact 22. Photoresist 26 is then stripped if not done so previously. Sidewalls 32 are formed by depositing a 4000 Angstrom $Si_3N_4$ (or $SiO_2$) layer over the entire surface using CVD techniques. This assures an isotropic coverage. The insulator is then etched in low pressure (about 10–20 mTorr) $CF_4/O_2$ RIE, making sure that the etch is anisotropic. The etch is continued until all of the insulator material on the flat wafer surface is removed. Due to the anisotropic nature of the etch, a portion of the insulator material remains along the edges of insulator islands 24 and emitter contacts 22 as shown in FIG. 3C. Next, the areas of emitter epilayer 20 that are not protected by insulator islands 28 and sidewalls 32 are chemically etched down to base epilayer 16 in, for example, a solution of $H_2SO_4:H_2O_2:H_2O$ in the ratio of 1:8:160 (by volume) as shown in FIG. 3C.

(f) Photoresist is again spun on and patterned to define the location of the base contacts 34; this exposes insulator islands 28 and sidewalls 32 in addition to a portion of the base epilayer 16. Ti/Pt/Au metals are evaporated in sequence at thicknesses of 500, 250 and 1500 Angstroms, respectively, onto the photoresist and exposed areas. The overhanging sidewalls 32 shadow the part of the base epilayer 16 adjacent to emitter 36, so the evaporated metal does not contact emitter 36. The photoresist is then removed which lifts off the metal except the portion 34 which is on the base epilayer 16 and the portion 38 which is on insulator island 28 and sidewalls 32. See FIG. 3D.

(g) A photoresist mask (not shown) is then deposited and patterned to define the connection to the subcollector layer 18. Layers 16, 12 and 14 are then etched using a solution of $H_2SO_4:H_2O_2:H_2O$ in the ratio of 1:8:160 (by volume), for example. Afterwards, AuGe/Ni/Au metals are evaporated onto the wafer to thicknesses of 500/140/2000 Å, respectively, to form the collector contact 40. Then photoresist layer is then stripped, which lifts off all excess metallization.

The most important design criterion for more independent control of $J_{max}$ and $BV_{ceo}$ is the formation of a first thin high-field region adjacent to a base and a second thick low-field region between the first region and the subcollector. The thickness of the first region should be such that the energy acquired by carriers traversing through the layer is less than the energy required for impact ionization in the material. As demonstrated, this is readily achieved with the device of the first preferred embodiment of the invention.

Figure 4:
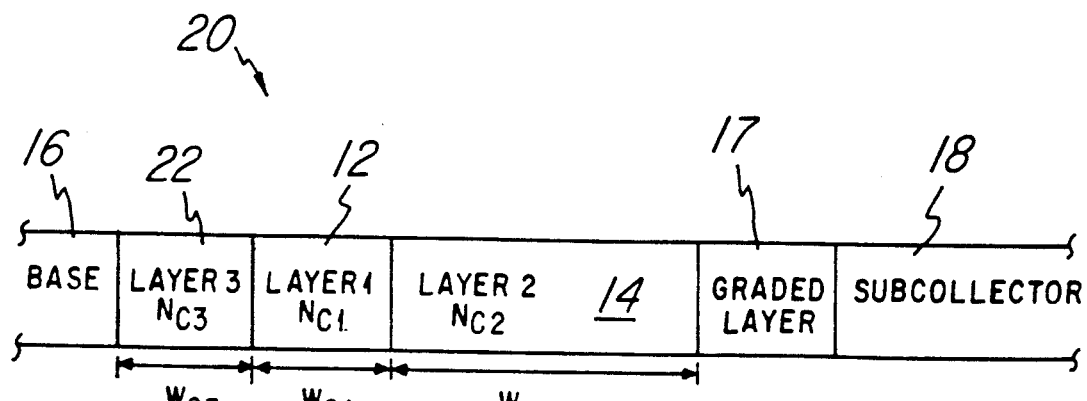
FIG. 4 is a schematic view of a third preferred embodiment of the present invention.

However, other structures potentially can achieve the same electric field profile. For example, a third preferred embodiment of the present invention is illustrated in FIG. 4 which meets this criterion. The third preferred embodiment of the present invention is comprised of a transistor indicated generally at 20, which is similar to the device of the first preferred embodiment of the present invention with the addition of a third collector layer 22 inserted between the base 16 and the first collector layer 12. The third collector layer 22 has a width (measured in the direction of current flow) $W_{C3}$ of 300 Angstroms, for example, and is doped at a relatively low concentration level $N_{C3}$, such as $10^{14}$ atoms/cm$^3$. To achieve maximum $BV_{ceo}$, layers 12 and 14 are made of AlAs and layer 22 is made of graded AlGaAs, with the aluminum composition varying from 100% (AlAs) at the interface with layer 12 to 0% (GaAs) at the interface with the base layer 16. Additionally, it is possible to let layer 12 remain as graded AlGaAs (as in the first preferred embodiment) and layer 22 be pure GaAs. Since this three-layer collector structure results in essentially the same electric field profile as the two-layer structure of the first preferred embodiment of the present invention, it will also allow substantially independent control of $J_{max}$ and $BV_{ceo}$.

An additional and important advantage of the present invention is that it will greatly reduce or eliminate the change in base-collector capacitance of a transistor in response to the base-collector bias. This change in capacitance can cause parametric oscillations and other problems in a bipolar transistor amplifier output.

A few preferred embodiments have been described in detail hereinabove. It is to be understood that the scope of the invention also comprehends embodiments different from those described, yet within the scope of the claims. For example, the combination of GaAs and AlGaAs has been used throughout the specification by way of illustration only. It will be obvious to those skilled in the art that the present invention may be practiced with any combination of materials having a disparity in their respective bandgaps as a mere design choice.

Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for making a multiple layer wide bandgap collector structure for bipolar transistors, said collector structure abutting a base layer of said transistor, comprising the steps of:
    forming a relatively thick, low doped or non-intentionally doped layer of a semiconductor material having a wider energy bandgap than said base layer; and
    forming a relatively thin, highly doped layer between said low doped or non-intentionally doped layer and said base layer.

2. The method of claim 1, further comprising the step of forming said highly doped layer to have a graded semiconductor composition in order to prevent a heterojunction from forming between said base layer and said low doped or non-intentionally doped layer.

3. The method of claim 1, further comprising the step of forming said highly doped layer thin enough to prevent energy acquired by a majority of carriers traversing said layer from being greater than the energy required for impact ionization in said layer.

4. The method of claim 1, further comprising the step of doping said highly doped layer to be fully depleted at a majority of base-collector bias voltages between zero and $BV_{ceo}$.

5. The method of claim 1, further comprising the step of causing said low doped or non-intentionally doped layer to have a dopant concentration of $<1\times10^{16}$ atoms/cm$^3$.

6. The method for claim 1, further comprising the step of doping said highly doped layer to have a dopant concentration of $>1\times10^{17}$ atoms/cm$^3$.

7. The method of claim 1, further comprising the step of forming said base layer of GaAs, said low doped or non-intentionally doped layer of $Al_xGa_{1-x}As$, and said highly doped layer is graded from GaAs at its interface with said base layer to $Al_xGa_{1-x}As$ at its interface with said low doped or non-intentionally doped layer.

8. The method of claim 1, further comprising the step of forming said bipolar transistor to be a heterojunction bipolar transistor (HBT).

9. A method for making a bipolar transistor, comprising the steps of:
   forming a substrate;
   epitaxially depositing a subcollector layer on said substrate;
   epitaxially depositing a first collector layer on said subcollector layer, said first collector layer being relatively thick and low doped or non-intentionally doped;
   epitaxially depositing a second collector layer on said first collector layer, said second collector layer being relatively thin and highly doped;
   epitaxially depositing a base layer on said second collector layer, wherein said first collector layer has a wider energy bandgap than said base layer; and
   epitaxially depositing an emitter layer on said base layer.

10. The method of claim 9, further comprising the step of forming said second collector layer to have a graded semiconductor composition in order to prevent the formation of a heterojunction between said first collector layer and said base layer.

11. The method of claim 9, further comprising the step of depositing said second collector layer thin enough to prevent energy acquired by a majority of carriers traversing said second collector layer from being greater than the energy required for impact ionization in said layer.

12. The method of claim 9, further comprising the step of doping said second collector layer to be fully depleted at a majority of base-collector bias voltages between zero and $BV_{ceo}$.

13. The method of claim 9, further comprising the step of causing said first collector layer to have a dopant concentration of $<1\times10^{16}$ atoms/cm$^3$.

14. The method for claim 9, further comprising the step of doping said second collector layer to have a dopant concentration of $>1\times10^{17}$ atoms/cm$^3$.

15. The method of claim 9, further comprising the step of forming said subcollector, said base and said emitter layers of GaAs, said first collector layer of $Al_xGa_{1-x}As$, and said second collector layer is $Al_xGa_{1-x}As$.

16. The method of claim 9, further comprising the step of forming said emitter layer of semiconductor material having a wider energy bandgap than said base layer.

* * * * *